US008333569B2

(12) United States Patent
Sauciuc et al.

(10) Patent No.: US 8,333,569 B2
(45) Date of Patent: Dec. 18, 2012

(54) METHOD AND APPARATUS FOR TWO-PHASE START-UP OPERATION

(75) Inventors: Ioan Sauciuc, Pheonix, AZ (US); Gregory M. Chrysler, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 1930 days.

(21) Appl. No.: 10/749,359

(22) Filed: Dec. 30, 2003

(65) Prior Publication Data

US 2005/0147500 A1 Jul. 7, 2005

(51) Int. Cl.
*F04B 49/04* (2006.01)
*F04B 49/00* (2006.01)

(52) U.S. Cl. ............. 417/63; 417/279; 62/212; 361/700
(58) Field of Classification Search ............... 417/63, 417/279, 313, 572; 62/212, 3, 2, 3.3, 3.7; 361/700
See application file for complete search history.

(56) References Cited

U.S. PATENT DOCUMENTS

| 3,766,747 | A |   | 10/1973 | Parker |  |
|---|---|---|---|---|---|
| 4,381,650 | A | * | 5/1983 | Mount | 62/157 |
| 4,475,686 | A |   | 10/1984 | Huelle et al. |  |
| 4,547,130 | A | * | 10/1985 | Eastman | 417/53 |
| 4,785,639 | A |   | 11/1988 | Biagini |  |
| 5,195,327 | A |   | 3/1993 | Kim |  |
| 5,255,520 | A | * | 10/1993 | O'Geary et al. | 62/3.2 |
| 5,497,625 | A | * | 3/1996 | Manz et al. | 62/3.3 |
| 6,402,479 | B1 | * | 6/2002 | Lagedamont et al. | 417/201 |
| 6,437,981 | B1 | * | 8/2002 | Newton et al. | 361/700 |
| 6,490,874 | B2 | * | 12/2002 | Chu et al. | 62/93 |
| 6,628,002 | B2 | * | 9/2003 | Ritz et al. | 257/712 |
| 6,663,352 | B2 | * | 12/2003 | Sabini et al. | 417/63 |
| 6,845,622 | B2 | * | 1/2005 | Sauciuc et al. | 62/3.7 |
| 2002/0144994 | A1 |   | 10/2002 | Golan et al. |  |
| 2002/0162339 | A1 | * | 11/2002 | Harrison et al. | 62/3.7 |
| 2003/0019235 | A1 |   | 1/2003 | Wall et al. |  |
| 2003/0062149 | A1 | * | 4/2003 | Goodson et al. | 165/104.11 |

(Continued)

FOREIGN PATENT DOCUMENTS

DE 2300377 7/1973

(Continued)

OTHER PUBLICATIONS

Notice of Preliminary Rejection dated Jul. 22, 2008 in Korean Patent Application No. 10-2006-7013084.

(Continued)

*Primary Examiner* — Charles Freay
*Assistant Examiner* — Patrick Hamo
(74) *Attorney, Agent, or Firm* — Blakely, Sokoloff, Taylor & Zafman LLP (57) ABSTRACT

A method and apparatus for removing vapor inside a liquid pump at the start up operation of the pump. In addition, a method and apparatus for removing liquid inside a compressor at the start up operation of the compressor. The pump and compressor each include a sensor attached to them that determines the physical state (i.e., liquid or vapor) of a material inside the pump or compressor. If vapor is detected inside the pump, a thermoelectric module connected to the pump is powered to condense the vapor into a liquid. Likewise, if liquid is detected inside the compressor a heater connected to the compressor is powered to evaporate the liquid into a vapor. After the state of the material inside the pump or compressor is changed, the pump or compressor is powered up for operation in a cooling system.

7 Claims, 7 Drawing Sheets

U.S. PATENT DOCUMENTS

| | | | |
|---|---|---|---|
| 2003/0205364 A1* | 11/2003 | Sauciuc et al. | 165/104.25 |
| 2004/0009075 A1* | 1/2004 | Meza et al. | 417/32 |
| 2005/0078451 A1* | 4/2005 | Sauciuc et al. | 361/700 |
| 2005/0091989 A1* | 5/2005 | Leija et al. | 62/3.2 |
| 2005/0174737 A1* | 8/2005 | Meir | 361/697 |

FOREIGN PATENT DOCUMENTS

| | | |
|---|---|---|
| DE | 4205918 | 8/1992 |
| EP | 1143778 | 10/2001 |
| GB | 1427926 | 3/1976 |
| GB | 1578966 | 11/1980 |
| WO | WO 96/31937 | 10/1996 |

OTHER PUBLICATIONS

Intel Corporation, *Office Action mailed Feb. 15, 2012 for German App No. 11 2004 002 607.5-51*, 19 pages.

* cited by examiner

METHOD AND APPARATUS FOR TWO-PHASE START-UP OPERATION

BACKGROUND

1. Field

Pumps and compressors.

2. Background

Embodiments of prior art two-phase (liquid/vapor) systems use a pump or a compressor to force either liquid or vapor through the system to, for example, cool various heat sources in the system. A two-phase system generally contains 10%-20% liquid and 80%-90% vapor within the interior of the system.

Typically, prior art embodiments orient the pump or compressor in a manner that will discourage the accumulation of vapor in a liquid pump after the system shuts down. Likewise, systems using a vapor compressor will orient the compressor in a manner that will discourage the accumulation of liquid in the compressor after the system shuts down.

In embodiments using a liquid pump, the pump pumps liquid through the system and is generally oriented at the lowest gravitational point in the system. The reason for this orientation is, when the system shuts down, gravity causes the heavier liquid to accumulate at the lowest point in the system while the lighter gases "bubble" to the highest point in the system. Having liquid accumulate at the lowest point in the system, and thus where the pump is located, is desirable since liquid pumps do not pump vapor very well. In fact, liquid pumps that pump vapor generally malfunction and/or break, and thus shorten the lifetime of the pump.

As a general matter, a liquid pump used in a two-phase system is more likely to encounter a situation where vapor accumulates inside it after shut down rather than during normal operation of the pump since the pump continually pushes liquid through the system. Therefore, the pump's orientation, and thus the risk of having to pump vapor, during operation is generally not a problem. However, when the pump shuts down, the chance the pump will accumulate vapor inside of it increases the farther the pump is away from the lowest gravitational point. Thus, pumps are generally oriented where gravity will encourage liquid to accumulate in the pump and encourage vapor to "bubble" away from the pump (i.e. the lowest gravitational point) after shut down.

Vapor compressor orientation is based upon similar principles as liquid pumps. However, the orientation is the exact opposite. With compressors, it is desirable for the compressor to be oriented at the gravitationally highest point of the system since compressors do not work very well when compressing liquids. Thus, with a high point orientation, vapor will "bubble" toward the high point, and thus accumulate in the compressor after shut down, while any liquid will flow toward the lowest gravitational point in the system.

Problems occur when a system requires a pump to be oriented somewhere other than the gravitational low point of the system or requires a compressor be oriented somewhere other than the gravitational high point of the system. When such a situation occurs, the pump or compressor may not deliver the desired performance and/or may not be capable of operating at all.

BRIEF DESCRIPTION OF THE DRAWINGS

Various embodiments are illustrated by way of example and not by way of limitation in the figures of the accompanying drawings in which like references indicate similar elements.

DETAILED DESCRIPTION

Figure 1:
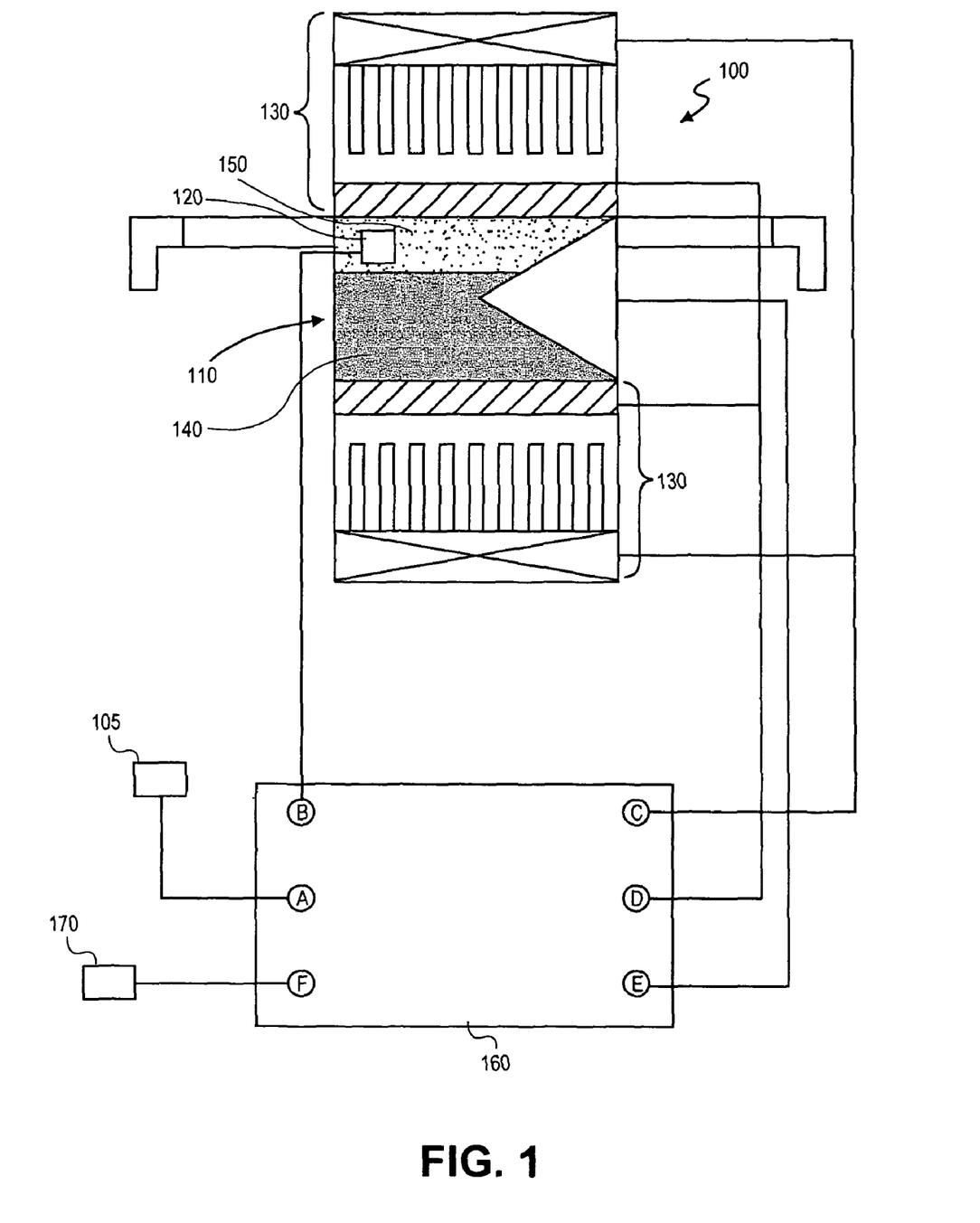
FIG. 1 shows one embodiment of an actuator including a thermoelectric module.

FIG. 1 shows one embodiment of an actuator including a thermoelectric module. In the embodiment shown in FIG. 1, actuator 100 includes fluid pump 110. Pump 110, in other embodiments, may be any type of device that forces liquid through a system.

In one embodiment, actuator 100 includes sensor 120. In one embodiment, sensor 120 is a temperature sensor. In the embodiment shown in FIG. 1, the temperature sensor is a resistance temperature detector (RTD) which changes resistance proportional to temperature change.

The RTD, in one embodiment, is a thin film element RTD. Other embodiments may include a wire-wound RTD element, a kapton insulated RTD element, or any type of RTD known in the art. Other suitable temperature sensors include, but are not limited to, a thermistor, an infrared sensor, a thermocouple or any other device capable of measuring a change in temperature.

In FIG. 1, sensor 120 is formed, in one embodiment, by depositing a thin film of, for example, platinum on to a ceramic plate. Other suitable elements include, but are not limited to, copper, nickel, nickel-iron or any other material suitable for use in a RTD. In addition, the substrate may be formed of silicon, gallium arsenide (GaAs), or any other material suitable for use in a RTD. Leads are attached to the platinum, and the substrate is coated with, for example, glass or epoxy.

As power is supplied to sensor 120, the resistance change per degree of temperature change is nearly linear throughout the temperature range of sensor 120. In one embodiment, a controller measures this resistance value and converts it into a temperature reading. Based on the current and voltage used, sensor 120 calculates the resistance. Thus, the resistance value of sensor 120, in one embodiment, increases as temperature increases (and decreases as temperature decreases).

Sensor 120, in one embodiment, uses a "base" resistance value to calculate temperature change. Platinum embodiments of sensor 120 have a base value of about 100 ohms to about 1000 ohms at 0° C. (32° F). In one embodiment, sensor 120 has a base value of about 100 ohms at 0° C. The following chart shows examples of base value ranges for some metals suitable for use in sensor 120.

| Element Type | Temperature Range | Base Resistance |
|---|---|---|
| Platinum | −200° to 850° C. | 100 Ω at 0° C. |
| Copper | −100° to 260° C. | 10 Ω at 25° C. |
| Nickel | −100° to 1000° C. | 120 Ω at 0° C. |

As current is supplied to sensor 120, sensor 120 measures the rate of change in temperature (thermal diffusivity) in pump 110. The rate at which the temperature changes determines the physical state (i.e., liquid 140 or vapor 150) of a substance contained inside pump 110.

In another embodiment, sensor 120 is a gas sensor. In one embodiment, the gas sensor is a carbon nanotube vapor ionization sensor. It is contemplated that sensor 120 may be any device capable of determining the existence of a vapor in an actuator.

In one embodiment, sensor 120 includes a cathode with a thin-film array containing a plurality of multiwall nanotubes and an anode. The anode, in one embodiment, is an aluminium sheet.

Since every vapor has a unique breakdown voltage, the electric field at which it is ionized, the existence of a vapor in pump 110 can be determined by measuring the breakdown voltage of the substance contained within pump 110. To do this, the individual nanotubes in the film, in one embodiment, create very high electric fields near their tips, and the combined effect of all the nanotubes increases the overall electric field to speed up the vapor breakdown process. Thus, by measuring the breakdown voltage of the substance contained within pump 110, sensor 120 is capable of determining the existence of a vapor in pump 110.

In one embodiment, sensor 120 is capable of detecting concentrations of vapor as low as $10^{-7}$ moles per liter. In another embodiment, sensor 120 is capable of distinguishing between different vapors in a mixture and is not affected by external factors such as temperature or humidity.

In the embodiment shown in FIG. 1, actuator 100 also includes thermoelectric modules 130 attached to pump 110. In other embodiments, actuator 100 may include more than two thermoelectric modules 130 or only one thermoelectric module 130.

Thermoelectric modules 130, in one embodiment, are oriented so that a "cold side" of thermoelectric modules 130 comes in contact with pump 110. The cold side of thermoelectric module 130 condenses vapor 150 contained in pump 110 into liquid 140. Thus, after sufficient condensation of vapor 150, pump 110, ideally, will only contain, and thus pump liquid 140. By pumping only liquid 140, pump 110 is more likely to function properly and less likely to "choke", or ideally, not choke at all.

In one embodiment, actuator 100 includes start up circuit 160. Start up circuit 160, when power switch 105 is turned on, is capable of controlling an automatic feedback system, discussed below.

Start up system circuit 160 sends a signal to sensor 120 to start checking the physical state of a substance contained within pump 110. If the substance is in an undesirable physical state, circuit 160 sends a signal to thermoelectric module 130 to start a process that changes the physical state of the substance contained in pump 110.

After the state has been sufficiently changed, start up system circuit 160 sends a signal to turn on pump 110. After a sufficient amount of time after pump 110 starts pumping, start up system circuit 160 sends a signal to start up heat sources 170 connected to actuator 100.

Figure 2:
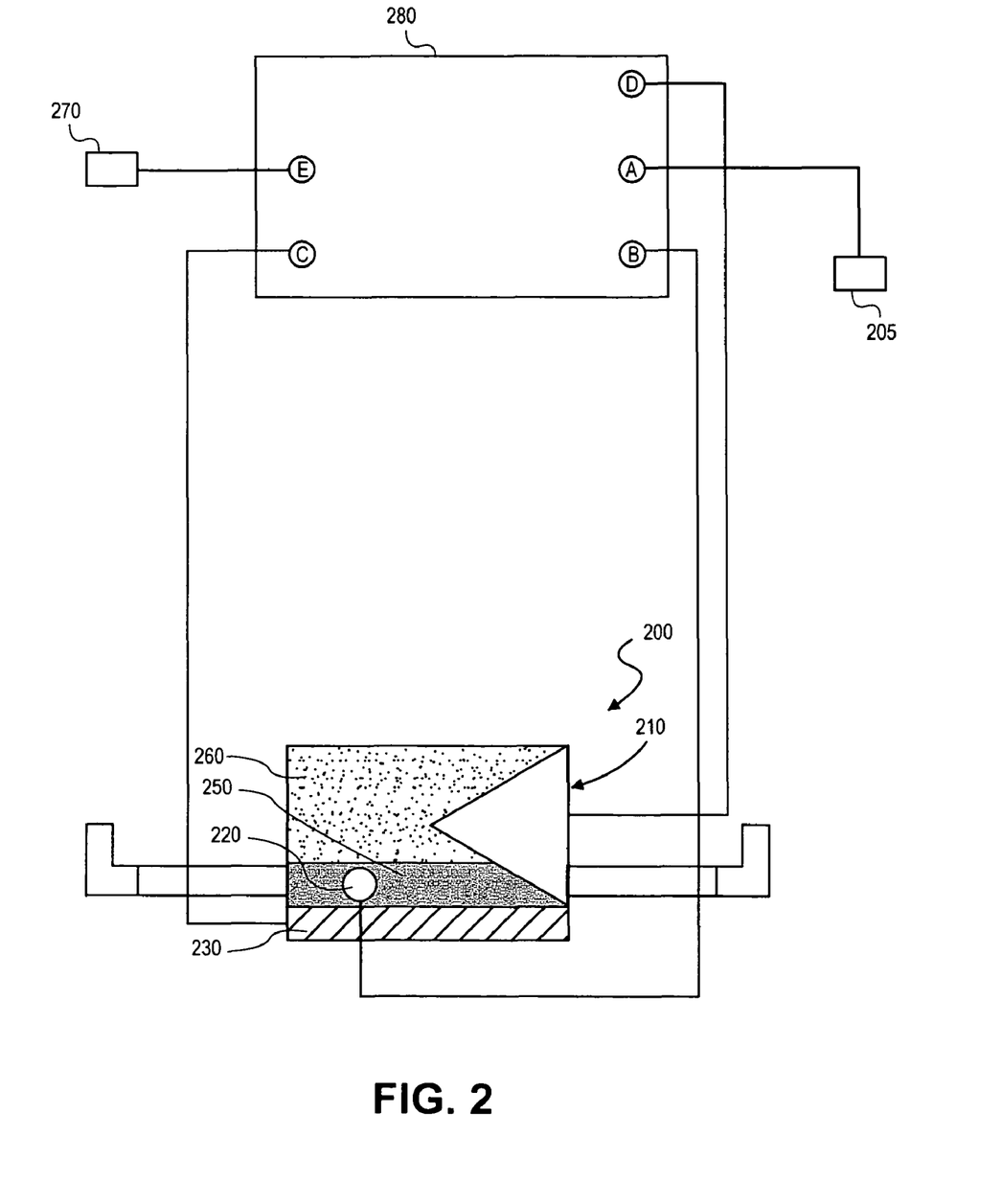
FIG. 2 shows another embodiment of an actuator including a heater.

FIG. 2 shows another embodiment of an actuator including a heater. In the embodiment shown in FIG. 2, actuator 200 includes compressor 210. Compressor 210, in other embodiments, may be any type of device that forces vapor through a system.

Actuator 200, in one embodiment, includes sensor 220 which may be any of the embodiments of sensor 120 discussed above with regard to FIG. 1. In the embodiment shown in FIG. 2, actuator 200 includes heater 230 connected to compressor 210.

Heater 230 may be any heater known in the art or any device capable of generating enough heat to heat a liquid into vapor (e.g., a TEC). In addition, other embodiments of actuator 200 may include a plurality of heaters 230.

Heater 230 is oriented so that liquid 250 will be exposed to heat generated by heater 230. When exposed to the heat, ideally, any liquid 250 contained in compressor 210 will evaporate into vapor 260. Thus, after sufficient evaporation of liquid 250, compressor 210 will, ideally, only contain vapor 260, and thus only compress vapor 260. By compressing only vapor, compressor 210 is more likely to function properly.

In one embodiment, actuator 210 includes start up circuit 280. Start up circuit 280, when power switch 205 is turned on, is capable of controlling an automatic feedback system, discussed below.

Start up system circuit 280 sends a signal to sensor 220 to start checking the physical state of a substance contained within compressor 210. If the substance is in an undesirable physical state, circuit 280 sends a signal to heater 230 to start a process that changes the physical state of the substance contained in compressor 210.

After the state has been sufficiently changed, start up system circuit 280 sends a signal to turn on compressor 210. After a sufficient amount of time after compressor 210 starts compressing, start up system circuit 280 sends a signal to start up heat source 270 connected to actuator 200.

Figure 3:
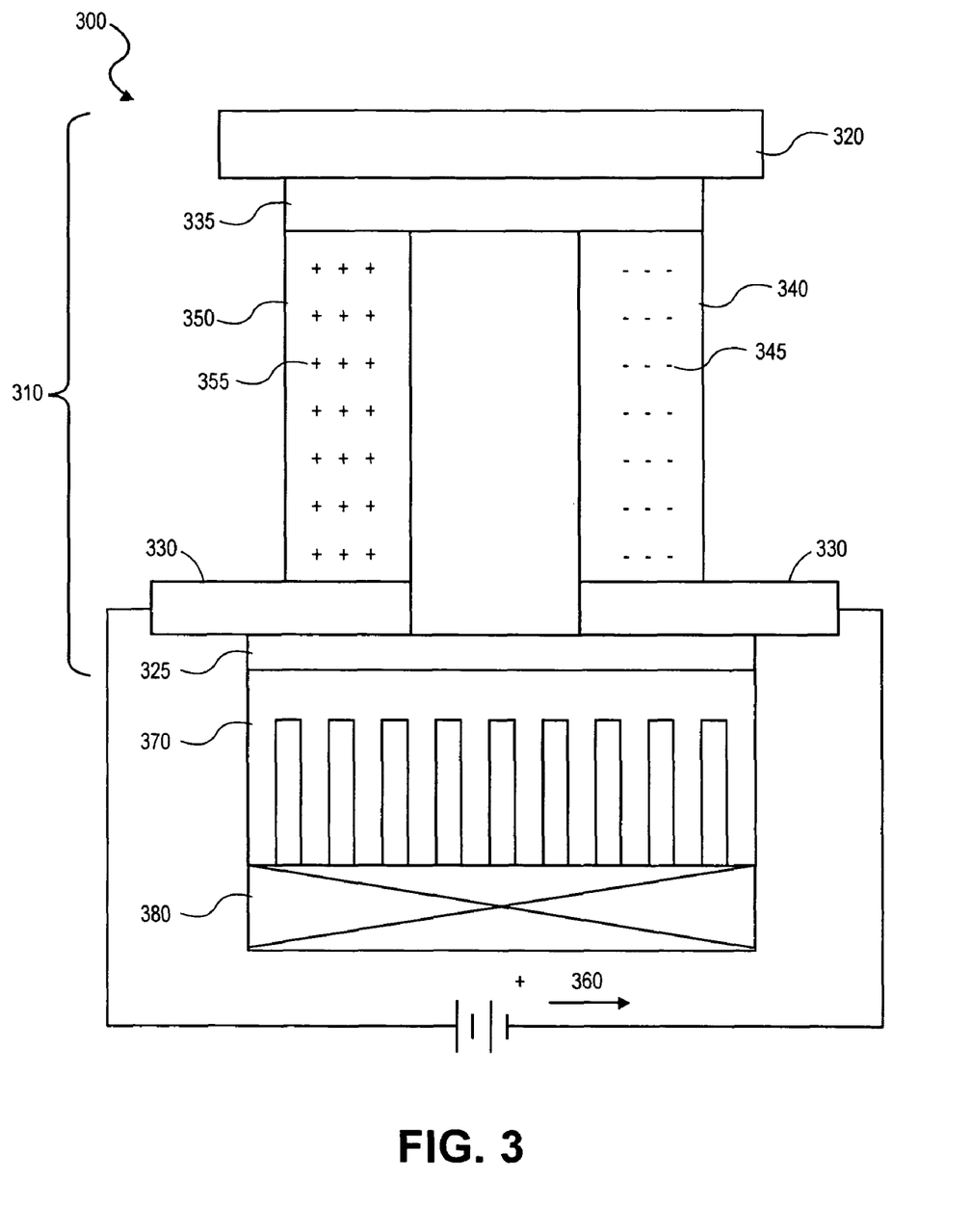
FIG. 3 shows one embodiment of the thermoelectric module illustrated in FIG. 1.

FIG. 3 shows one embodiment of a thermoelectric module. In one embodiment, thermoelectric module 300 is a solid state device that pumps heat against a temperature differential utilizing electrical energy. Thermoelectric module 300, in one embodiment, is thermoelectric cooler (TEC) 310. In other embodiments, thermoelectric module 300 includes any combination of TEC 310, heat sink 370 and fan 380 (e.g., TEC 310 and fan 380; TEC 310, heat sink 370 and fan 380; fan 380; etc.). Thermoelectric module 300 may, in other embodiments, be any device capable of causing vapor to condense into a liquid.

Based on the Peltier effect, TEC 310 consists of n- and p-type columns 340, 350 of semiconductor material heavily doped with electrical carriers 345, 355. In one embodiment, columns 340, 350 are soldered to copper conductors 330, 335 so that columns 340, 350 are connected electrically in series and thermally in parallel. Other suitable materials for conductors 330, 335 include, but are not limited to, gold, silver, platinum, titanium, tantalum, aluminum, or any other metal or alloy suitable for electrical conduction.

In one embodiment, columns 340, 350 and conductors 330 are affixed to ceramic substrates 320, 330, one on each side of columns 340, 350. Other suitable materials for substrates 320, 330 include, but are not limited to silicon, gallium arsenide (GaAs), or any other material suitable for forming a substrate.

As current 360 is applied to thermoelectric module 300, electrons 345 move freely in conductors 330 but not freely in substrate 325. As electrons 345 leave column 340 and enter column 350, electrons 345 must change place with holes 355 in order to move through the p-type material of column 350. As electrons 345 and holes 355 change position, electrons 345 drop to a lower energy level and release heat in the process into substrate 325 to create a "hot side".

As electrons 345 move from column 350 into conductor 335, electrons 345 are bumped back to a higher energy level and absorb heat in the process. Electrons 345 move freely through conductor 335 until they reach substrate 320.

As electrons 345 move into column 340, they must bump up an energy level in order to move through the substrate and heat is absorbed to create a "cold side". As electrons 345 leave the hot side of the n-type, they are able to again move freely in conductor 330 and release heat by dropping to a lower energy level.

As a note, reversing the direction of current 360 through thermoelectric module 300 changes the heat orientation of the sides. Thus, substrates 320 and 325 may be hot or cold depending upon the direction of the current.

Figure 4:
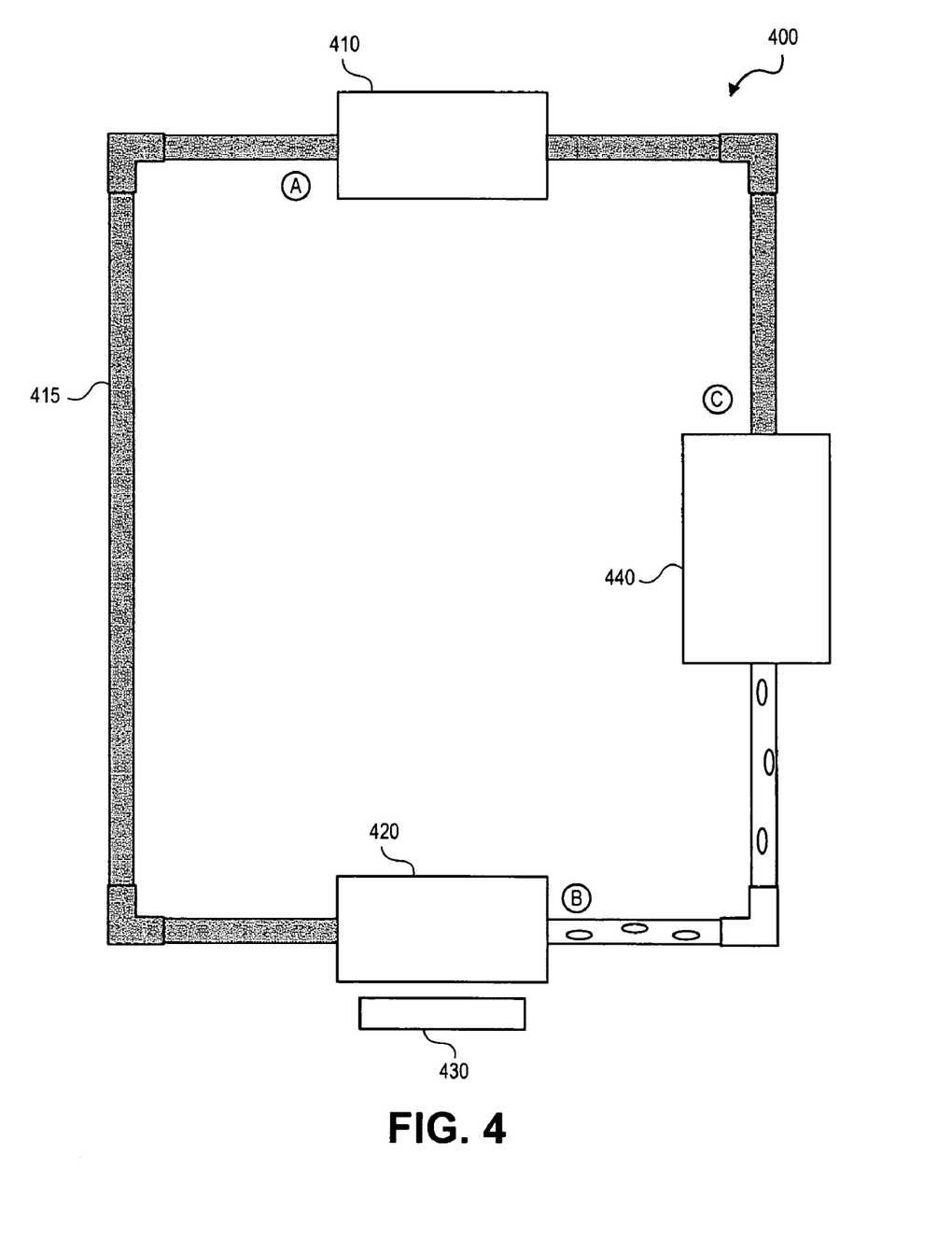
FIG. 4 shows one embodiment of a system to cool a heat source including the actuator shown in FIG. 1.

FIG. 4 shows an embodiment of a two-phase (liquid/vapor) system to, for example, cool heat sources. In the embodiment shown in FIG. 4, system 400 is used to cool heat sources of a computer.

In one embodiment, system 400 is a sealed, closed-loop two-phase system. System 400, in one embodiment, includes actuator 410. Actuator 410 may be any embodiment or combination of embodiments of actuator 100 discussed above.

At point (A) of FIG. 4, liquid is pumped from actuator 410 through tubing 415 into cold plate 420. In one embodiment, the liquid being pumped through system 400 is water. Other suitable liquids for use in system 400 include, but are not limited to, alcohols (e.g., isopropyl, phenols, etc.), refrigerants (e.g., r11, r12, r13, r22, r23, r113, r114, r115, r116, r134a, r500, r502, r503, etc.) and any other liquid suitable for absorbing energy (heat).

In an embodiment, cold plate 420 is a metal container with a heat enhancement surface (e.g., tubing) inside. In addition, cold plate 420 may, in other embodiments, be any type of cold plate known in the art or any other device capable of absorbing heat from a component with which the device is connected.

Cold plate 420, in one embodiment, is connected to heat source 430. Heat source 430, in one embodiment, is a central processing unit (CPU). Other heat sources which cold plate 420 may be connected to include, but are not limited to, an I/O controller, a memory controller or any other heat source in a computer.

As liquid passes over the heat enhancement surface in cold plate 420, the liquid absorbs heat from component 430 and converts some of the liquid to gas (vapor). Since the liquid flowing through cold plate 420 expands, cold plate 420 should be strong enough to withstand any buildup of internal pressure.

At point (B) in FIG. 4, the liquid/vapor combination (fluid) has exited cold plate 420. In one embodiment, the fluid has a quality of about 0.3 (30% vapor). The fluid in other embodiments may have a quality in the range of about 0.1 to about 1.0. The fluid is then forced, in one embodiment, into heat exchanger 440.

In one embodiment, heat exchanger 440 is a tube-fin heat exchanger. In addition, heat exchanger 440 may, in other embodiments, be any type of heat exchanger known in the art or any device capable of removing heat and compressing fluid into liquid. As fluid enters heat exchanger 440, heat exchanger 440 removes heat from the fluid, condensing the fluid back into liquid.

At point (C) of FIG. 4, the fluid that entered heat exchanger 440 has been converted back into liquid. In one embodiment, the fluid is returned to actuator 410 to be pumped back through system 400.

In one embodiment, system 400 is connected to heat source 430 using a thermal interface between cold plate 420 and heat source 430. In another embodiment, system 400 can be fabricated on a die along with heat source 430.

Since any vapor contained within actuator 410 may be condensed prior to powering actuator 410, the problems generally associated with the orientation of pumps within a system are overcome. Therefore, actuator 410 may be oriented anywhere after heat exchanger 440 and before cold plate 420 within system 400, without regard to the gravitationally low point of system 400. Thus, as shown in FIG. 4, actuator 410 may be oriented at the gravitationally high point of system 400 without affecting the performance of system 400 or actuator 410.

Figure 5:
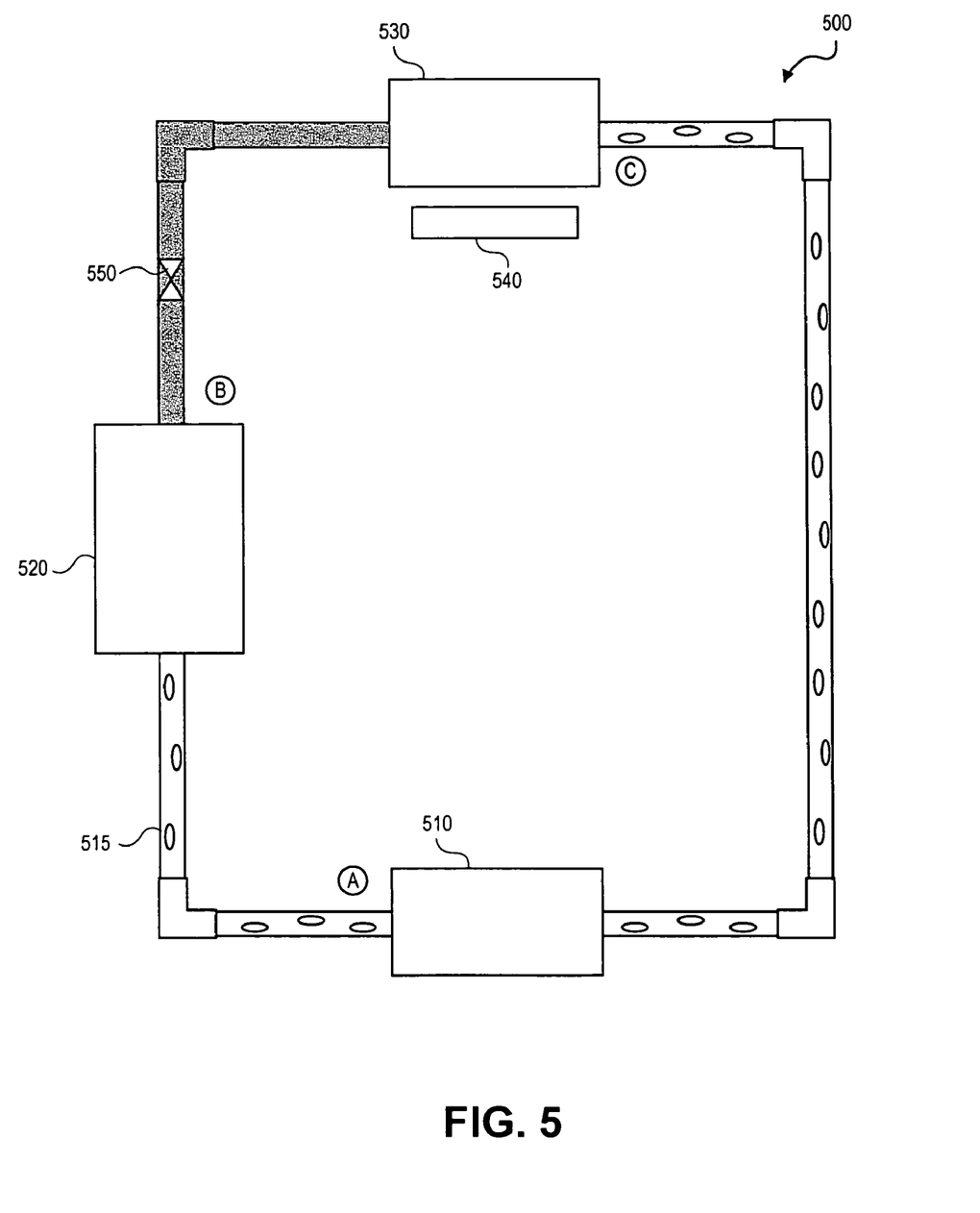
FIG. 5 shows an embodiment of a system to cool a heat source including the actuator shown in FIG. 2.

FIG. 5 shows an embodiment of a system for cooling heat sources. In the embodiment shown in FIG. 5, system 500 is used to cool heat sources of a computer similar to embodiments discussed above with reference to FIG. 4.

System 500, in one embodiment, includes actuator 510, tubing 515, heat exchanger 520 cold plate 530, heat source 540 and expansion valve 550. Actuator 510 may be any embodiment or combination of embodiments of compressor 200 discussed above. In addition, tubing 515, heat exchanger 520 cold plate 530 and heat source 540 are similar to tubing 415, heat exchanger 440 cold plate 420 and heat source 430, respectively, discussed above.

At point (A) of FIG. 5, vapor is forced from actuator 510 through tubing 515 into heat exchanger 520. As vapor enters heat exchanger 520, heat exchanger 520 removes heat from the vapor, condensing the vapor into fluid.

At point (B) in FIG. 5, fluid exits heat exchanger 520. In one embodiment, the fluid passes through expansion valve 550 to, in one embodiment, reduce the pressure and temperature of the fluid in tubing 515 before being forced into cold plate 530.

Expansion valve 550 may be any expansion valve known in the art or any device capable of reducing pressure in tubing 515. As the fluid enters cold plate 530, the fluid passes over the heat enhancement surface in cold plate 530 to absorb heat from heat source 540 and convert the fluid back into vapor.

At point (C) of FIG. 5, the fluid that entered cold plate 530 has been converted back into vapor. In one embodiment, the vapor is returned to actuator 510 to be forced back through system 500.

Since any liquid contained within actuator 510 may be evaporated prior to powering actuator 510, the problems generally associated with the orientation of compressors within a system are overcome. Therefore, actuator 510 may be placed anywhere after cold plate 530 and before heat exchanger 520 within system 500, without regard to the gravitationally high point of system 500.

Thus, as shown in FIG. 5, actuator 510 may be oriented at the gravitationally low point of system 500 without affecting the performance of system 500 or actuator 510. In addition, similar to system 400, embodiments of system 500 may include cold plate 530 being connected to heat source 540 using a thermal interface or system 500 may be fabricated on a die along with heat source 540.

Figure 6:
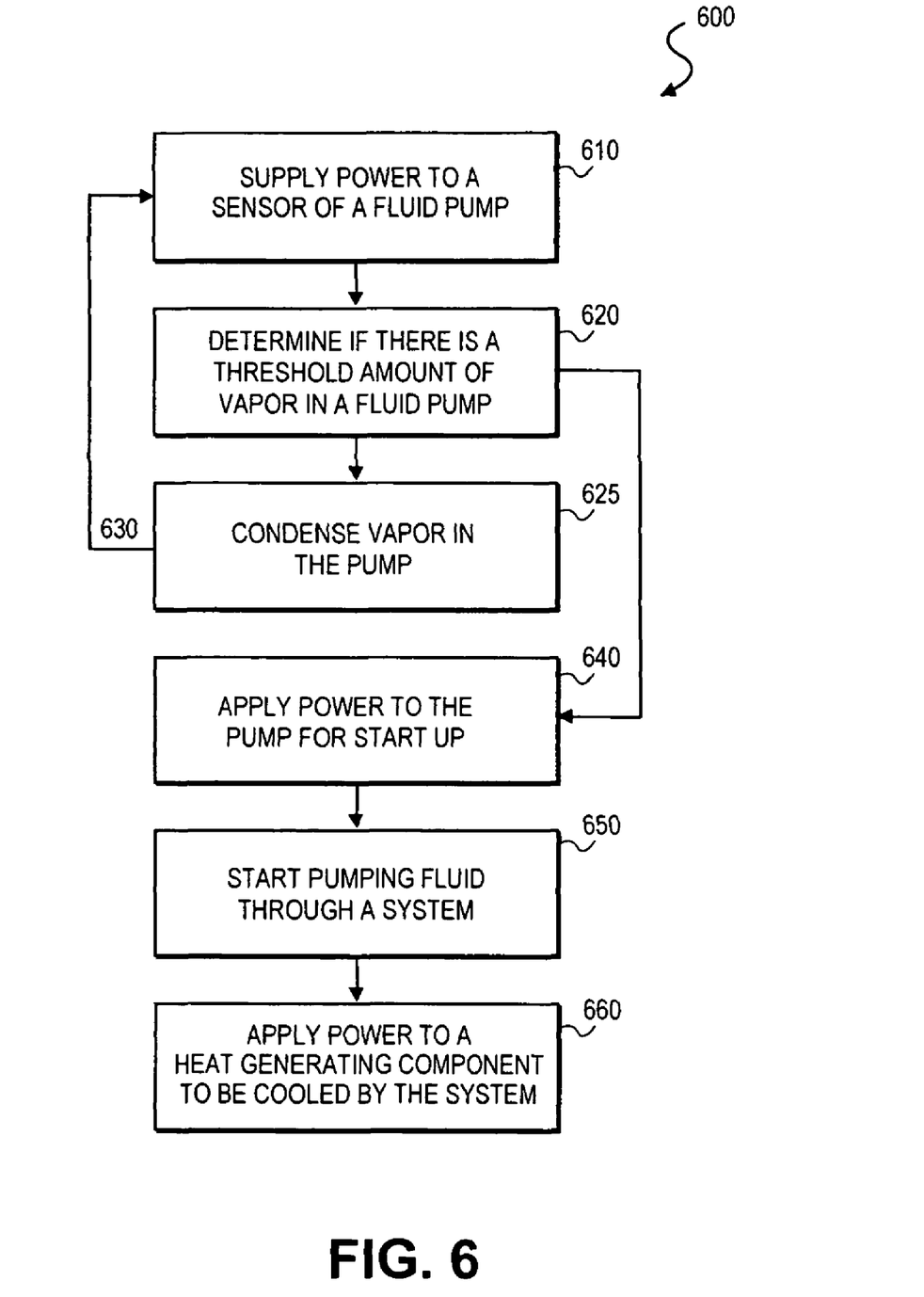
FIG. 6 shows a flow diagram of one embodiment of a method for start up operation of the system shown in FIG. 4.

FIG. 6 shows a flow diagram of an embodiment of a method to perform a start up operation of a cooling system. Method 600 begins by supplying power to a sensor of an actuator (block 610). In the embodiment shown in FIG. 6, the actuator is a liquid pump. The sensor and actuator may be any of the embodiments of a sensor and actuator discussed above.

The rate of change in temperature, measured by a temperature sensor, in the actuator or the breakdown voltage, measured by a gas sensor, of a substance contained within the actuator determines whether there is a threshold amount of vapor in the actuator (block 620). Thus, a threshold amount of vapor can be determined by measuring the rate of change in temperature in the actuator or the breakdown voltage of the substance contained in the actuator. Embodiments of method 600 may include any of the substances discussed above.

If the sensor detects a threshold amount of vapor in the actuator, in one embodiment, power is supplied to a thermoelectric module of the actuator to condense vapor found in the actuator into a liquid (block 625). In one embodiment, the sensor (temperature) is shut off once power is supplied to the thermoelectric module. In another embodiment, the sensor (gas) continuously measures the breakdown voltage of the substance in the actuator. The thermoelectric module may be any of the embodiments discussed above.

Since each substance capable of being used in method 600 has a different latent heat (or heat of vaporization), the amount of exposure time to the thermoelectric module will vary. In one embodiment, after some vapor has condensed into liquid, power is supplied to the sensor of the actuator to determine whether there is still a threshold amount of vapor in the actuator (block 630). If a threshold amount continues to be present, in one embodiment, power to the thermoelectric module is maintained to continue to condense vapor into liquid. This process of checking for the presence of a threshold amount of vapor (blocks 610 and 620) and condensing vapor (block 625) continues (block 630) until the sensor determines a threshold amount of vapor does not exist in the actuator.

When the sensor determines a threshold amount of vapor does not exist in the actuator (whether initially or after vapor has been condensed in the pump), in one embodiment, the sensor is shut off, the thermoelectric module is shut off and power is supplied to the actuator (block 640). When power is supplied to the actuator, the actuator starts pumping fluid through a system (block 650).

Once fluid starts to circulate through the system, a heat source connected to the system is powered up (block 660). In one embodiment, the heat source is a CPU. The heat generating-component, in other embodiments, may also be an I/O controller, a memory controller, any other heat source that needs to be sufficiently cooled or combinations thereof (including the CPU).

Figure 7:
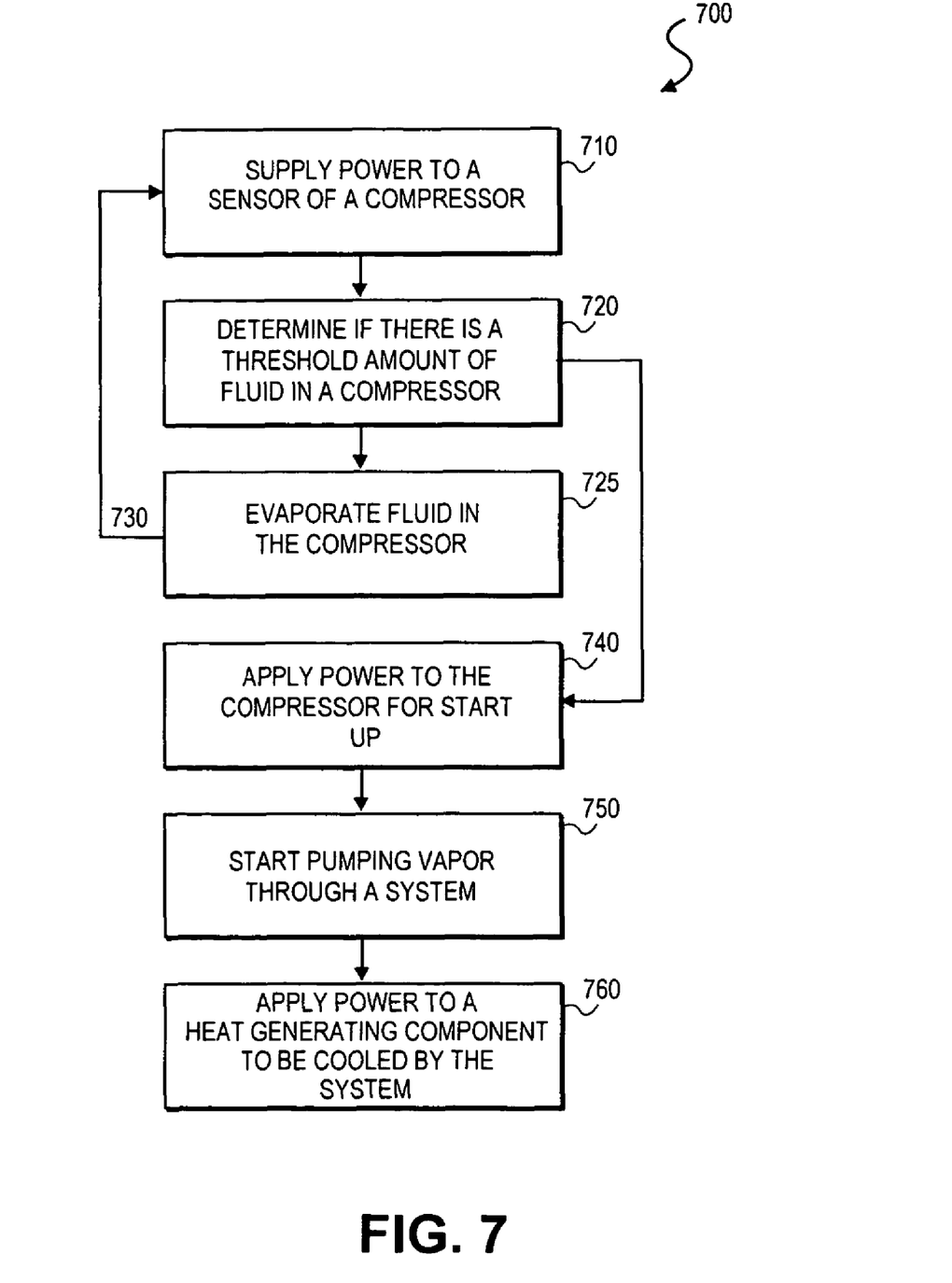
FIG. 7 shows a flow diagram of an embodiment of a method for start up operation of the system shown in FIG. 5.

FIG. 7 shows a flow diagram of an embodiment of a method to perform a start up operation of a cooling system similar to the method discussed above in FIG. 6. In the embodiment shown in FIG. 7, the actuator is a compressor. The actuator may be any of the embodiments of an actuator discussed above.

Embodiments of FIG. 7 use sensors to determine the presence of a liquid in the actuator (blocks 710 and 720). The sensors may be any of the sensors discussed above.

If a threshold amount of liquid is found in the actuator, in one embodiment, a heater is used to heat the liquid into vapor (blocks 725). In one embodiment, this process is repeated (block 730) until a threshold amount of liquid does not exist in the actuator. After a threshold amount no longer exists, in one embodiment, the actuator is turned on (blocks 740 and 750). In one embodiment, after the actuator has been in operation for a pre-determined amount of time, any heat sources within the cooling system are turned on (block 760).

In the foregoing specification, the invention has been described with reference to specific embodiments thereof. It will, however, be evident that various modifications and changes can be made thereto without departing from the broader spirit and scope of embodiments of the invention as set forth in the appended claims. The specification and drawings are, accordingly, to be regarded in an illustrative rather than a restrictive sense.

We claim:

1. A method, comprising:
   (a) orienting a pump or a compressor without regard to a gravitational location of a heat source coupled to the pump or compressor;
   (b) determining a presence of a threshold amount of a fluid that is within the pump or the compressor, wherein determining comprises checking a sensor coupled to the pump or compressor; and
   (c) condensing vapor of the fluid as it is present in the pump or evaporating liquid of the fluid as it is present in the compressor.

2. A method, comprising:
   (a) orienting a pump or a compressor without regard to a gravitational location of a heat source coupled to the pump or compressor;
   (b) determining a presence of a threshold amount of a fluid that is within the pump or the compressor;
   (c) condensing vapor of the fluid as it is present in the pump or evaporating liquid of the fluid as it is present in the compressor; and
   (d) repeating (b) and (c) until there is no longer a threshold amount of the fluid in the pump or compressor.

3. The method of claim 2, further comprising:
   (e) after (d), applying power to the pump or compressor.

4. The method of claim 3, wherein the heat source is a first source, and further comprising:
   (f) applying power to a second heat source coupled to the pump or compressor.

5. A method, comprising:
   (a) orienting a pump or a compressor without regard to a gravitational location of a heat source coupled to the pump or compressor;
   (b) determining a presence of a threshold amount of a fluid that is within the pump or the compressor;
   (c) condensing vapor of the fluid as it is present in the pump or evaporating liquid of the fluid as it is present in the compressor; and
   (d) powering on the pump after condensing, or powering on the compressor after evaporating.

6. A method, comprising:
   (a) orienting a pump or a compressor without regard to a gravitational location of a heat source coupled to the pump or compressor;
   (b) determining a presence of a threshold amount of a fluid that is within the pump or the compressor; and
   (c) condensing vapor of the fluid as it is present in the pump or evaporating liquid of the fluid as it is present in the compressor, wherein the fluid is within the pump and the pump is a liquid pump to force liquid through a system.

7. A method, comprising:
   (a) orienting a pump or a compressor without regard to a gravitational location of a heat source coupled to the pump or compressor;
   (b) determining a presence of a threshold amount of a fluid that is within the pump or the compressor; and
   (c) condensing vapor of the fluid as it is present in the pump or evaporating liquid of the fluid as it is present in the compressor, wherein the fluid is within the compressor and the compressor is a vapor compressor to force vapor through a system.

* * * * *